United States Patent
Ha et al.

(10) Patent No.: US 8,067,770 B2
(45) Date of Patent: Nov. 29, 2011

(54) THIN FILM TRANSISTOR AND FLAT PANEL DISPLAY DEVICE INCLUDING THE SAME

(75) Inventors: Jae-Heung Ha, Suwon-si (KR); Young-Woo Song, Suwon-si (KR); Jong-Hyuk Lee, Suwon-si (KR); Yong-Tak Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 411 days.

(21) Appl. No.: 12/183,451

(22) Filed: Jul. 31, 2008

(65) Prior Publication Data
US 2009/0218570 A1 Sep. 3, 2009

(30) Foreign Application Priority Data
Mar. 3, 2008 (KR) .................. 10-2008-0019692

(51) Int. Cl.
*H01L 29/04* (2006.01)

(52) U.S. Cl. ............... 257/57; 257/40; 257/52; 257/59; 257/E51.024; 257/E33.004

(58) Field of Classification Search ............ 257/40, 257/52, 57, 59, E51.005, E51.018, E51.024, 257/E51.025, E33.003, E33.004
See application file for complete search history.

(56) References Cited

U.S. PATENT DOCUMENTS

| 5,696,387 A | 12/1997 | Choi et al. |
| 2005/0199879 A1 | 9/2005 | Hoffman et al. |
| 2005/0279279 A1* | 12/2005 | Hosono et al. ......... 117/68 |

FOREIGN PATENT DOCUMENTS

| JP | 2007-142195 | 6/2007 |
| KR | 1997-13427 | 3/1997 |

OTHER PUBLICATIONS

Kamiya et al. ("Field-Induced Current Modulation in Nanoporous Semiconductor, in Electron-Doped 12CaO-7Al2O3" Chemical Materials, vol. 17, Nov. 25, 2005).*

Kamiya, Toshio et al. "Field-Induced Current Modulation in Nanoporous Semiconductor, Electron-Doped 12CaO•7AlO." *Chemistry of Materials*. 2005, vol. 17. 8 pages.

Hideo Hosono, "Recent progress in transparent oxide semiconductors: Materials and device application", Thin Solid Films, Elsevier-Sequoia S.A., Lausanne, CH, vol. 515, No. 15, Jan. 24, 2007, pp. 6000-6014, XP022212810.

* cited by examiner

*Primary Examiner* — Matthew E Warren
(74) *Attorney, Agent, or Firm* — H.C. Park & Associates, PLC (57) ABSTRACT

A thin film transistor includes a channel layer including an amorphous $12CaO.7Al_2O_3$ (C12A7) and a flat panel display device including the same. According to the present invention, the amorphous channel layer can be formed at a low temperature using C12A7. The thin film transistor including the amorphous channel layer has excellent electron mobility.

21 Claims, 6 Drawing Sheets

THIN FILM TRANSISTOR AND FLAT PANEL DISPLAY DEVICE INCLUDING THE SAME

CROSS-REFERENCE TO RELATED APPLICATIONS

This application claims the benefit of Korean Patent Application No. 2008-19692, filed on Mar. 3, 2008, in the Korean Intellectual Property Office, the disclosure of which is incorporated herein by reference.

BACKGROUND OF THE INVENTION

1. Field of the Invention

Aspects of the present invention relate to a thin film transistor and a flat panel display device including the same, and more particularly, to a thin film transistor including a channel layer including an amorphous 12CaO.7Al2O3 (C12A7), and a flat panel display device including the same.

2. Description of the Related Art

A field effect transistor is an active device including a gate electrode, source electrode, and a drain electrode, and is operated by applying a voltage to the gate electrode to control a current flowing between the source and drain electrodes. In particular, a field effect transistor using a thin film as a channel layer on an insulating substrate formed of ceramic, glass, or plastic is referred to as a thin film transistor (TFT).

Because TFTs use a thin film technology, they can be easily formed on a substrate with a relatively large surface area, and are widely used as driving units of flat panel display devices, such as liquid crystal displays (LCDs). That is, image pixels can be turned on or off using TFTs formed on the substrate. In particular, it is predicted that pixel currents can be efficiently controlled by TFTs in future high-performance organic light-emitting devices. Moreover, a TFT circuit driving and controlling the entire image can be formed on the substrate around the image display region, thereby providing a high performance LCD device.

The most widely used form of TFT uses a polycrystalline silicon film or an amorphous silicon film as a channel layer material. Such a TFT is disclosed in Korean Patent Laid-open Publication No. 1997-0013427. However, in the case of an amorphous silicon or a polycrystalline silicon, a high temperature process is required, and it is difficult to form films of such materials on a plastic or a film substrate.

Organic semiconductor films, such as pentacene, are being developed as a material that can form a film on a plastic substrate at a low temperature. Such organic semiconductors have an aromatic ring, and a large carrier mobility is obtained from the stacking direction of the aromatic ring when crystallized. However, organic semiconductors, such as pentacene, are generally not stable in higher temperatures. An ohmic contact between the source and drain electrode-forming material and the organic semiconducting layer-forming material of a conventional thin film transistor is almost impossible, due to the work function difference between them. Moreover, source and drain electrodes are conventionally composed of inorganic materials, while an organic semiconducting layer is composed of organic materials, and thus the adhesive force between the source/drain electrodes and the organic semiconducting layer is not satisfactory.

SUMMARY OF THE INVENTION

Aspects of the present invention provide a thin film transistor including a channel layer including an amorphous 12CaO.7Al2O3(C12A7). Aspects of the present invention also provide a flat panel display device including the thin film transistor.

According to an aspect of the present invention, there is provided a thin film transistor including a gate electrode formed on a substrate, source and drain electrodes insulated from the gate electrode, a channel layer insulated from the gate electrode and electrically connected to the source and drain electrodes, and an insulating layer disposed between the channel layer and the gate electrode, wherein the channel layer comprises an amorphous 12CaO.7Al$_2$O$_3$(C12A7), or there is provided a thin film transistor including source and drain electrodes formed on a substrate, a gate electrode insulated from the source and drain electrodes, a channel layer electrically connected to the source and drain electrodes, and is insulated from the gate electrode, and an insulating layer disposed between the channel layer and the gate electrode, wherein the channel layer comprises an amorphous 12CaO.7Al$_2$O$_3$.

According to aspects of the present invention, the thickness of the channel layer may be 5 to 200 nm. According to aspects of the present invention, the channel layer may be formed by heat-treating the 12CaO.7Al$_2$O$_3$ film, deposited on the insulating layer, at a temperature of 100 to 600° C. According to aspects of the present invention, the substrate may be a SUS substrate, a glass substrate, or a plastic substrate. According to aspects of the present invention, the band gap value of the channel layer may be 3 to 3.5 eV.

According to aspects of the present invention, there is provided a flat panel display device including the thin film transistor previously described and a display device. According to aspects of the present invention, the display device may be an organic light-emitting device (OLED) or a liquid crystal display (LCD) device.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings of which.

DETAILED DESCRIPTION OF THE EMBODIMENTS

Reference will now be made in detail to the exemplary embodiments of the present invention, examples of which are illustrated in the accompanying drawings, wherein like reference numerals refer to the like elements throughout. The exemplary embodiments are described below in order to explain the present invention by referring to the figures. It will be understood that when an element is referred to as being "disposed on" or "formed on" another element, it may be directly disposed or formed on the other element or intervening elements may be present. In contrast, when an element is referred to as being "directly disposed on" or "directly formed on" another element, there are no intervening elements present. Other words used to describe the relationship between elements should be interpreted in a like fashion (e.g., "between" versus "directly between", "adjacent" versus "directly adjacent", etc.).

Figure 1:
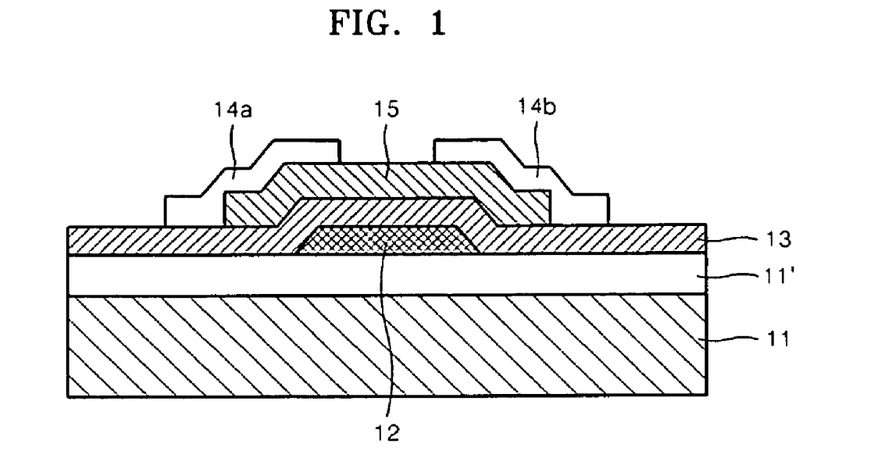
FIG. 1 is a cross-sectional view schematically illustrating a structure of a thin film transistor according to an exemplary embodiment of the present invention.

A thin film transistor according to aspects of the present invention includes a channel layer of an amorphous film formed with $12CaO.7Al_2O_3$ (C12A7). FIG. 1 is a cross-sectional view schematically illustrating a structure of a thin film transistor (TFT) according to an exemplary embodiment of the present invention Referring to FIG. 1, the thin film transistor (TFT) according to the current exemplary embodiment of the present invention includes a substrate 11, a buffer layer 11', a gate electrode 12, an insulating layer 13, source and drain electrodes 14a and 14b, and a channel layer 15. The substrate 11 may be a metal oxide, such as $BaTiO_3$, $LaAlO_3$, and MgO; an SUS substrate; a glass substrate; a plastic substrate; or the like but is not limited thereto. The buffer layer 11' is formed on the substrate 11 and may be formed of SiOx or the like but is not limited thereto. However, the buffer layer 11' may be omitted. The gate electrode 12 is formed on the buffer layer 11' and may include at least one metal or an alloy of two or more selected from the group consisting of Au, Ag, Cu, Ni, Pt, Pd, Al, Mo, Nd, W, ITO and IZO, but is not limited thereto. The insulating layer 13 is formed to cover the gate electrode 12. The source and drain electrodes 14a and 14b are each formed on the insulating layer 13. The source and drain electrodes 14a and 14b may, as illustrated in FIG. 1, be partially overlapped with the gate electrode 12, but aspects of the present invention are not limited thereto. The source and drain electrodes 14a and 14b may include, for example, at least one metal or an alloy of two or more selected from the group consisting of Au, Pd, Pt, Ni, Rh, Ru, Ir, Os, ITO, Mo, MoW, IZO, Al and Ti, but is not limited thereto. The channel layer 15 electrically connecting the source and drain electrodes 14a and 14b is formed between the source and drain electrodes 14a and 14b. Meanwhile, FIG. 1 shows the channel layer 15 formed underneath the source and drain electrodes 14a and 14b, but the channel layer 15 may also be formed on top of the source and drain electrodes 14a and 14b.

The channel layer 15 may be formed of an amorphous $12CaO.7Al_2O_3$. The channel layer 15 may be formed by heat-treating a film of $12CaO.7Al_2O_3$ deposited at room temperature using a method such as sputtering. The heat-treating may be performed at a temperature of 100 to 600° C., preferably 100 to 400° C., and more preferably 300 to 400° C. Since further processes after the heat treatment process are not required in the channel layer forming process, the thin film transistor according to the current exemplary embodiment of the present invention may be manufactured more conveniently than a conventional thin film transistor.

Such a channel layer including the amorphous $12CaO.7Al_2O_3$ is formed at a relatively low temperature, and therefore, substrates formed of metal oxides, such as $BaTiO_3$, $LaAlO_3$, or MgO, as well as a SUS substrate, a glass substrate, or a plastic substrate may be used in the thin film transistor according to aspects of the present invention.

Moreover, since the channel layer can be formed at a low temperature, the channel layer can be formed to have a thickness of 200 nm or less, preferably 5 to 200 nm, and more preferably 5 to 100 nm. If the thickness of the channel layer is less than 5 nm, the thin film may not be formed uniformly, and if the thickness of the channel layer is greater than 200 nm, the manufacturing process may become difficult and electrical properties, such as conductivity, may be decreased.

While the band gap value of crystalline $12CaO.7Al_2O_3$ is 6.4 to 6.7 eV, the amorphous channel layer 15 formed in the thin film transistor according to aspects of the present invention has a band gap value in the range of 3 to 4 eV, and preferably 3 to 3.5 eV. The thin film transistor including a channel layer having such a low band gap range exhibits excellent electrical characteristics. Meanwhile, if the band gap value is less than 3 eV, the thin film transistor cannot be used in visible light display devices due to visible light absorption, which is not desirable.

Figure 2:
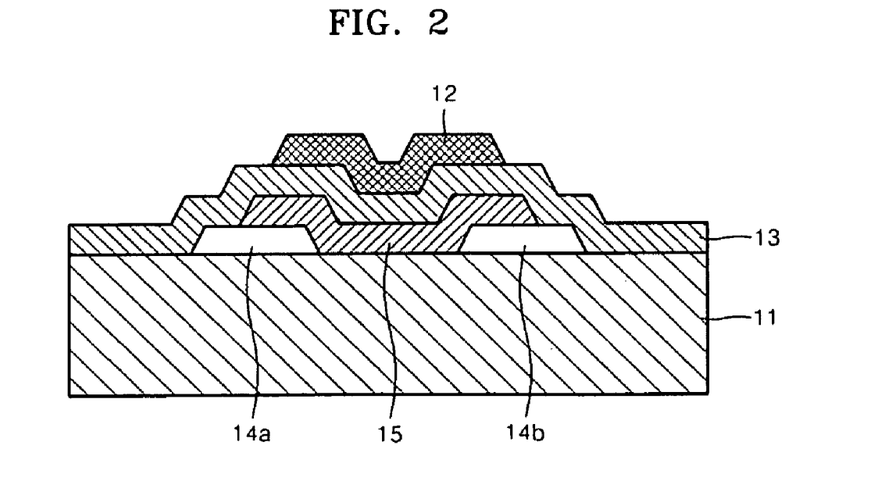
FIG. 2 is a cross-sectional view schematically illustrating a structure of a thin film transistor according to another exemplary embodiment of the present invention.

FIG. 2 is a cross-sectional view of a thin film transistor according to another exemplary embodiment of the present invention. Referring to FIG. 2, the thin film transistor according to the current exemplary embodiment of the present invention includes a substrate 11, source and drain electrodes 14a and 14b, a channel layer 15, an insulating layer 13, and a gate electrode 12. The substrate 11 may be formed of metal, glass, or plastic, or the like as described above but is not limited thereto. The source and drain electrodes 14a and 14b are formed on the substrate 11, and are electrically connected to the channel layer 15. The material forming the channel layer 15 is as previously described. The insulating layer 13 is formed on the channel layer 15 to insulate the channel layer 15 from the gate electrode 12.

Although FIG. 2 illustrates the channel layer 15 formed on the source and drain electrodes 14a and 14b, various modifications to the thin film transistor are possible, such as the channel layer 15 being formed on the substrate 11 and the source and drain electrodes 14a and 14b being formed thereon. In this case, the insulating layer 13 is disposed between the source and drain electrode 14a and 14b and the gate electrode 12. Further, aspects of the present invention are not limited thereto such that the thin film transistor of FIG. 2 may include a buffer layer 11' disposed on the substrate 11.

A method of manufacturing the thin film transistor according to aspects of the present invention may include, taking the thin film transistor of FIG. 1 as an example, forming an insulating layer to cover a gate electrode formed on a substrate to insulate the gate electrode; depositing a channel layer-forming C12A7 film on the insulating layer; forming source and drain electrodes on the C12A7 film; and heat-treating the resulting product at 100 to 600° C. to form the channel layer.

If necessary, the source and drain electrodes 14a and 14b may be formed on the insulating layer 13, and then the channel layer-forming C12A7 film may be deposited so as to cover the source and drain electrodes 14a and 14b.

Figure 3:
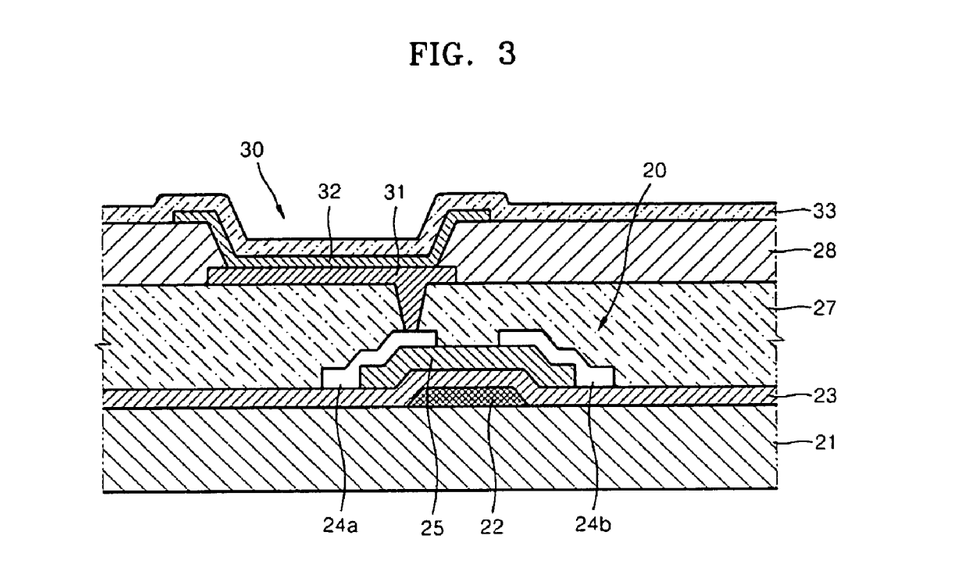
FIG. 3 is a cross-sectional view of a flat panel display device including a thin film transistor of the present invention, according to an exemplary embodiment of the present invention.

The thin film transistor having the above-described structure may be included in a flat panel display device such as an LCD or an organic light-emitting device. FIG. 3 is a cross-sectional view of an organic light-emitting device, such as a flat panel display device including the thin film transistor according to aspects of the present invention, according to an exemplary embodiment of the present invention. The structure illustrated in FIG. 3 represents a single subpixel of the organic light-emitting device. Each of such subpixels is a self-emissive device, which includes an organic light-emitting device (EL device) and at least one thin film transistor according to aspects of the present invention. Moreover, although not illustrated in FIG. 3, a separate capacitor is included in each of the subpixels. Such an organic light-emitting device may display various pixel patterns according to the emission color of the EL device (OLED), preferably including red, green, and blue pixels.

Such a red (R), green (G), or blue (B) subpixel may include at least more than one TFT and a self-emitting EL device (OLED), as illustrated in FIG. 3. In addition, each subpixel may be a TFT, which may be the TFT according to the current exemplary embodiment previously described. However, each subpixel is not limited thereto, and the thin film transistor may also have other various structures.

Referring to FIG. 3, the organic light-emitting device according to the current exemplary embodiment of the present invention includes a thin film transistor 20 formed on a substrate 21. The substrate 21 may be an insulating substrate. Further, although not shown, a buffer layer may be formed on the substrate 21. The thin film transistor 20 includes a gate electrode 22 formed on the substrate 21 in a predetermined pattern, and an insulating layer 23 formed on the gate electrode 22. Then, source and drain electrodes 24a and 24b are each formed on the insulating layer 23 corresponding to the gate electrode 22. The source and drain electrodes 24a and 24b are disposed on a channel layer 25. However, aspects of the present invention are not limited thereto such that the source and drain electrodes 24a and 24b may be formed on the insulating layer 23 and the channel layer 25 may be disposed on the source and drain electrodes 24a and 24b as described above. After the channel layer 25 is formed, a passivation film 27 having a single or multi-layer structure is formed so as to cover the thin film transistor 20. The passivation film 27 may include an organic material, an inorganic material, or an organic/inorganic complex material. An organic light-emitting film 32 of an EL device 30 is formed on the passivation film 27 in accordance with a pixel-defining film 28. The EL device 30, a device displaying predetermined image information by emitting red, green, or blue colored light according to current flow, includes a pixel electrode 31 connected to one of the source and drain electrodes 24a and 24b of the thin film transistor 20, a counter electrode 33 disposed to cover the entire pixel, and an organic light-emitting film 32 disposed between the pixel electrode 31 and the counter electrode 33. The aspects of present invention are not limited to the above-described structure, but may be applied to various structures of organic light-emitting devices.

The pixel electrode 31 and the counter electrode 33 are insulated from each other by the organic light-emitting film 32, and voltage of different polarities is applied to the pixel electrode 31 and the counter electrode 33 to induce light emission from the organic light-emitting film 32. The organic light-emitting film 32 may be a low molecular weight or a high molecular weight organic film. If the organic light-emitting film 32 is formed of a low molecular organic film, a hole injection layer (HIL), a hole transport layer (HTL), an emission layer (EML), an electron transport layer (ETL), and an electron injection layer (EIL) may be stacked in a singular or a complex structure to form the organic light-emitting film 32, and the organic material may also include various materials, such as copper phthalocyanine (CuPc), N,N'-di(naphthalene-1-yl)-N,N'-diphenyl-benzidine (NPB), and tris-8-hydroxyquinoline aluminum (Alq3). Such a low molecular organic film may be formed using vacuum deposition. The high molecular organic film may have a structure including the HTL and the EML, wherein PEDOT may be used to form the HTL, and poly-phenylenevinylene (PPV)-based or polyfluorene-based polymer organic materials may be used to form the EML. Such a high molecular organic film may be formed using screen printing or inkjet printing. The organic light-emitting film 32 is not limited to the above exemplary embodiments, and may have various structures.

The pixel electrode 31 may be an anode, and the counter electrode 33 may be a cathode. In the case of a liquid crystal display device, contrastingly, a bottom-oriented film (not shown) covering the pixel electrode 31 may be formed on the liquid crystal display device, thereby completing the manufacture of the bottom substrate of the liquid crystal display device. Such a thin film transistor according to aspects of the present invention may be mounted on each subpixel as in FIG. 3, or may be mounted on a driver circuit (not shown) which does not create images.

Figure 4:
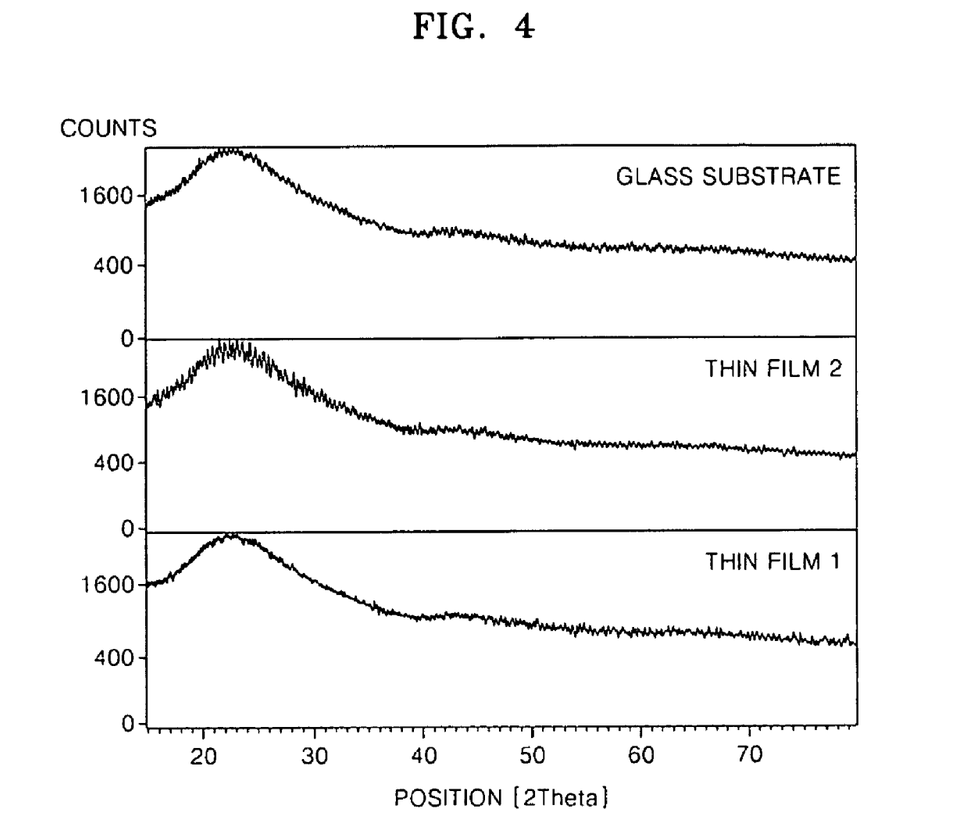
FIG. 4 is a spectrum illustrating an XRD analysis result of a channel layer formed in a thin film transistor according to an exemplary embodiment of the present invention.

FIG. 4 is a spectrum illustrating an XRD analysis result of a channel layer formed in a thin film transistor according to an exemplary embodiment of the present invention. Referring to FIG. 4, it can be verified that the channel layers of the thin film transistors according to aspects of the present invention are amorphous, similar to a glass substrate. Thin film 1 represents the channel layer 15 of FIG. 1, and thin film 2 represents the channel layer 15 of FIG. 2.

Aspects of the present invention will now be described with reference to the following examples. However, these examples are for illustrative purposes and are not intended to limit the scope of the present invention.

EXAMPLES

<Assessment of 12CaO.7Al$_2$O$_3$ Thin Film Properties>

Two identical glass substrates were sputtered using 12CaO.7Al$_2$O$_3$ as a sputter target, at 25% partial oxygen pressure (Ar: 40 sccm, O$_2$: 13 sccm) under a deposition pressure of 6.0×10$^{-3}$ torr with 700 W power RF mode at room temperature. The resulting material was heated at 350° C. in order to obtain thin films of 29 nm (thin film 1) and 50 nm (thin film 2).

Figure 5:
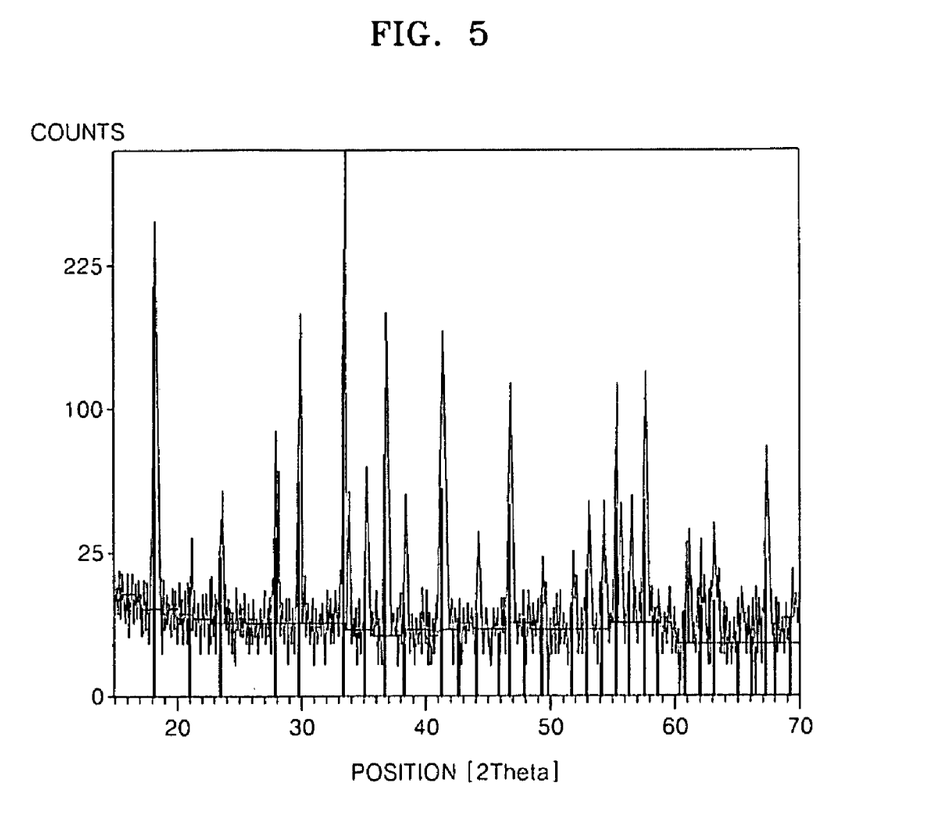
FIG. 5 is a spectrum illustrating an XRD analysis result of 12CaO.7Al$_2$O$_3$ powder used as a channel layer-forming sputter target.

The thin films were analyzed using XRD and the results are shown in FIG. 4, along with the XRD spectrum of the glass substrate. Meanwhile, XRD analysis results of the 12CaO.7Al$_2$O$_3$ powder used as the thin film-forming sputter target are shown in FIG. 5. While the 12CaO.7Al$_2$O$_3$ powder used as the sputter target in FIG. 5 exhibits crystallinity, the entire thin film formed on the glass substrate was verified to be amorphous as shown in FIG. 4.

Figure 6:
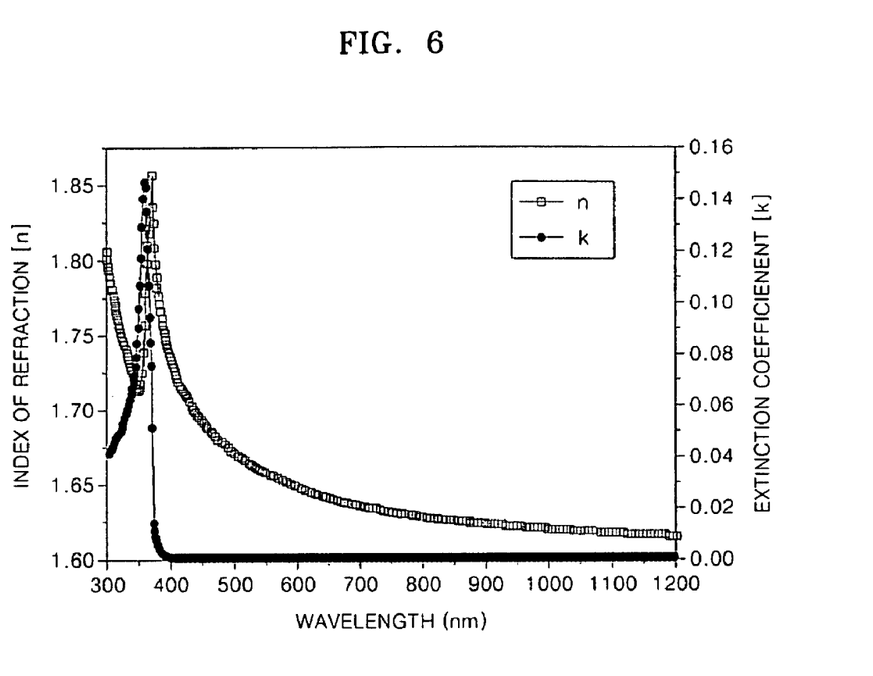
FIG. 6 is a graph illustrating a diffraction rate and absorption coefficient of a channel layer formed in a thin film transistor according to an exemplary embodiment of the present invention, measured according to the wavelength.

Furthermore, the index of diffraction (n) and extinction coefficient (k) with regards to thin film 1 were measured at different wavelengths, and are shown in FIG. 6. Referring to FIG. 6, the obtained amorphous film was verified to have the maximum extinction coefficient at a wavelength of 360.42 nm. This was entered in a relational expression below to obtain a band gap value of the amorphous film of 3.45 eV.

$$E=hc/\lambda (h=4.14\times10^{-15}eV, c=3\times10^8 m/s)$$

<Manufacturing of Thin Film Transistor>

Example 1

A glass substrate on which silicon oxide (SiO$_x$) was formed was prepared, and a gate electrode composed of MoW was formed thereon at a thickness of 200 nm. Then, silicon nitride (SiN$_x$) was deposited on the gate electrode at a thickness of 200 nm to form an insulating layer. The insulating layer was sputtered with 12CaO.7Al$_2$O$_3$ as the sputter target, at 25% partial oxygen pressure (Ar: 40 sccm, O$_2$: 13 sccm) and under a eutectic pressure of 6.0×10$^{-3}$ torr with a 700 W power at room temperature. Then, IZO was deposited on the resulting film to form source and drain electrodes having a thickness of 150 nm, and the structure washeat-treated at a temperature of 350° C. to complete the manufacture of a thin film transistor including a channel layer having a thickness of 20 nm.

Figure 7:
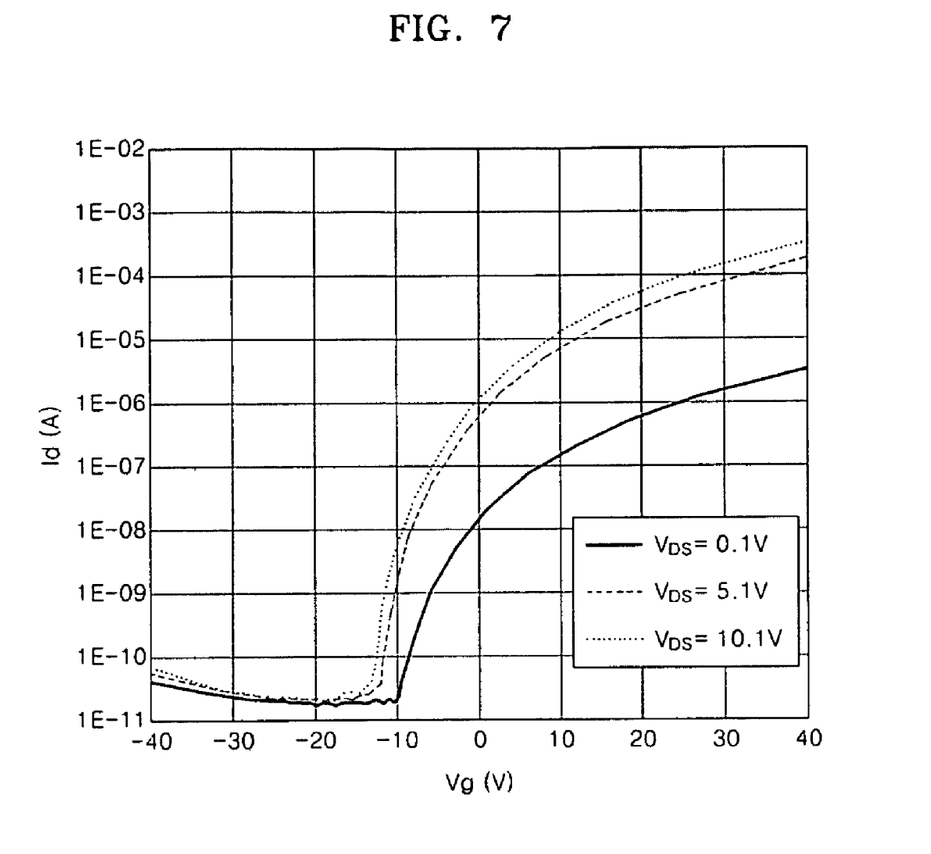
FIG. 7 is a graph illustrating a current-voltage characteristic of a thin film transistor according to an exemplary embodiment of the present invention.

Evaluation of voltage-current characteristics was performed using an HP4155 (a probe station of HP Inc). The voltage-current characteristics of the obtained thin film transistor were evaluated, and a linear mobility measured at $V_{DS}$=0.1V and saturation mobilities measured at $V_{DS}$=5.1V and $V_{DS}$=10.1V were obtained. Referring to FIG. 7, the linear mobility was 9.54 cm$^2$/Vs, the saturation mobility was 1.68 cm$^2$/Vs, threshold voltage was 9.8V, and on-off ratio was 9.67×10$^6$, demonstrating that the organic thin film transistor has excellent electrical characteristics.

Comparative Example 1

A polycrystalline 12CaO.7Al$_2$O$_3$ thin film was deposited on an MgO substrate using a PLD method, and was heat-treated at a temperature of 1000° C. The resulting thin film was treated with H$_2$$^+$ at a temperature of 600° C. to form a channel layer having a thickness of 1000 nm, and gate and source electrodes formed of Pt were formed thereon at a thickness of 40 nm. Y$_2$O$_3$ was deposited on the gate and source electrodes at a thickness of 350 nm to form an insulating layer. Then, Au was deposited on the insulating layer at a thickness of 300 μm to form a gate electrode, thereby completing the manufacture of a thin film transistor.

The voltage-current characteristics of the thin film transistor of the Comparative Example 1 were evaluated using the same method as in Example 1. The field effect mobility remained at 0.05 cm$^2$/Vs, and the on-off ratio was 10.

Although a few exemplary embodiments of the present invention have been shown and described, it would be appreciated by those skilled in the art that changes may be made in these exemplary embodiments without departing from the principles and spirit of the invention, the scope of which is defined in the claims and their equivalents.

What is claimed is:

1. A thin film transistor, comprising:
a gate electrode formed on a substrate;
source and drain electrodes insulated from the gate electrode;
a channel layer insulated from the gate electrode and electrically connected to the source and drain electrodes; and
an insulating layer disposed between the channel layer and the gate electrode,
wherein the channel layer comprises an amorphous 12CaO.7Al$_2$O$_3$.

2. The thin film transistor of claim 1, wherein the thickness of the channel layer is 5 to 200 nm.

3. The thin film transistor of claim 1, wherein the channel layer is formed by heat-treating a film of 12CaO.7Al$_2$O$_3$ deposited on the insulating layer at a temperature of 100 to 600° C.

4. The thin film transistor of claim 1, wherein the substrate comprises one of a SUS substrate, a glass substrate, and a plastic substrate.

5. The thin film transistor of claim 1, wherein a band gap value of the channel layer is 3 to 3.5 eV.

6. The thin film transistor of claim 1, further comprising a buffer layer disposed on the substrate between the gate electrode and the substrate.

7. A thin film transistor, comprising:
source and drain electrodes formed on a substrate;
a gate electrode insulated from the source and drain electrodes;
a channel layer electrically connected to the source and drain electrodes, and insulated from the gate electrode; and
an insulating layer disposed between the channel layer and the gate electrode,
wherein the channel layer comprises an amorphous 12CaO.7Al$_2$O$_3$.

8. The thin film transistor of claim 7, wherein the thickness of the channel layer is 5 to 200 nm.

9. The thin film transistor of claim 7, wherein the channel layer is formed by heat treating a 12CaO.7Al$_2$O$_3$ film deposited on the insulating layer at a temperature of 100 to 600° C.

10. The thin film transistor of claim 7, wherein the substrate comprises one of a SUS substrate, a glass substrate, and a plastic substrate.

11. The thin film transistor of claim 7, wherein a band gap value of the channel layer is 3 to 3.5 eV.

12. The thin film transistor of claim 7, further comprising a buffer layer disposed on the substrate between the substrate and the source and drain electrodes and the channel layer.

13. A flat panel display device comprising:
the thin film transistor according to claim 1; and
a display device.

14. The flat panel display device of claim 13, wherein the display device is one of an organic light-emitting device and a liquid crystal display device.

15. A flat panel display device comprising:
the thin film transistor according to claim 7; and
a display device.

16. The flat panel display device of claim 15, wherein the display device is one of an organic light-emitting device and a liquid crystal display device.

17. A thin film transistor, comprising:
a gate electrode formed on a substrate;
an insulating layer disposed to cover the gate electrode;
a channel layer disposed on the insulating layer to correspond to the gate electrode; and
source and drain electrodes electrically connected to the channel layer,
wherein the channel layer comprises an amorphous 12CaO.7Al$_2$O$_3$.

18. The thin film transistor of claim 17, further comprising a buffer layer disposed on the substrate between the gate electrode and the substrate.

19. The thin film transistor of claim 17, wherein portions of each of the source and drain electrodes are disposed on the channel layer and the insulating layer.

20. A thin film transistor, comprising:
source and drain electrodes disposed on a substrate;
a channel layer disposed on the substrate to electrically connect the source and drain electrodes;
an insulating layer disposed to cover the source and drain electrodes and the channel layer; and
a gate electrode disposed on the insulating layer to correspond to the channel layer,
wherein the channel layer comprises an amorphous 12CaO.7Al$_2$O$_3$.

21. The thin film transistor of claim 20, further comprising a buffer layer disposed on the substrate between the substrate and the source and drain electrodes and the channel layer.

* * * * *